United States Patent [19]
Itagaki et al.

[11] Patent Number: 5,912,475
[45] Date of Patent: Jun. 15, 1999

[54] OPTICAL SEMICONDUCTOR DEVICE WITH INP

[75] Inventors: Takushi Itagaki; Daisuke Suzuki; Tatsuya Kimura, all of Tokyo, Japan

[73] Assignee: Mitsubishi Denki Kabushiki Kaisha, Tokyo, Japan

[21] Appl. No.: 08/767,924

[22] Filed: Dec. 17, 1996

[30] Foreign Application Priority Data

Jun. 12, 1996 [JP] Japan ................................... 8-151233

[51] Int. Cl.⁶ ................................................. H01L 33/00
[52] U.S. Cl. ........................... 257/94; 257/96; 257/97; 257/102; 257/103; 372/45; 372/46; 372/47; 372/48
[58] Field of Search ................................ 257/96, 97, 94, 257/102, 103; 372/48, 45, 46, 47

[56] References Cited

FOREIGN PATENT DOCUMENTS 61-104687  5/1986  Japan .
408162701  6/1996  Japan .

OTHER PUBLICATIONS

Aoki et al., "InGaAs/InGaAsP MQW Electroabsorption Modulator Integrated With A DFB Laser Fabricated By Band–Gap Energy Control Selective Area MOCVD", IEEE Journal of Quantum Electronics, vol. 29, No. 6, Jun. 1993, pp. 2088–2096.

Miyazaki et al., "Novel Current–Blocking Structure For High–Speed EA–Modulator/DFB–LD Integrated Light Source", Tenth International Conference on Integrated and Optical Fibre Communication Technical Digest, vol. 4, Jun. 1995, pp. 60–61.

Primary Examiner—William Mintel
Attorney, Agent, or Firm—Leydig, Voit & Mayer, Ltd.

[57] ABSTRACT

An optical semiconductor device includes an n-type InP substrate having top and bottom surfaces; a stripe-shaped mesa structure including an n-type cladding layer, a multi quantum well layer, and a p-type first upper cladding layer disposed on the top surface of the substrate; a first layer of a semi-insulating material, an n-type InP hole blocking layer having a carrier concentration equal to or less than $4\times10^{18}$ cm$^{-3}$ and more than $1\times10^{18}$ cm$^{-3}$, and a second layer of the semi-insulating material disposed burying the mesa structure; a second p-type cladding layer and a p-type contact layer disposed on the mesa structure and on the second layer of the semi-insulating material, and p side electrodes spaced from each other in a stripe direction of the mesa structure, disposed on the p-type contact layer; and an n side electrode disposed on the bottom surface of the substrate. Therefore, an optical semiconductor device is available which has superior element isolation characteristics and broad modulation bandwidth, and enables the individual elements to operate with the utmost performance.

3 Claims, 8 Drawing Sheets

OPTICAL SEMICONDUCTOR DEVICE WITH InP

FIELD OF THE INVENTION

The present invention relates to an optical semiconductor device and, more particularly, to an optical semiconductor device with an integrated a semiconductor laser and an optical modulator.

BACKGROUND OF THE INVENTION

Recently, development of an optical semiconductor device integrating a semiconductor laser and an optical modulator has been continued for application to high-capacity high-speed optical fiber communication. In this optical semiconductor device, a distributed-feedback semiconductor laser (hereinafter referred to as DFB laser) is operated by direct current, and the amount of the optical absorption a the laser light radiated from this laser is changed in an electric-field absorption type optical modulator by electric-field modulation, which modulator is disposed in the laser emission direction of the DFB laser, thereby performing as a high-speed intensity modulator. In comparison with a conventional direct modulation method which directly changes a driving current of a semiconductor laser, in this optical semiconductor device employing an electric-field absorption type modulator, wavelength chirping of the laser light is reduced, resulting in advantages in high-speed long-distance optical communication.

A description is given of a prior art optical semiconductor device integrating a DFB laser and a light absorption type modulator, which is illustrated in "InGaAs/InGaAsP MQW Electroabsorption Modulator Integrated with a DFB Laser Fabricated by Band-Gap Energy Control Selective Area MOCVD", IEEE J. Quantum Electron., Vol. 29, pp.2088–2096, 1993 by M. Aoki et al. FIG. 5 is a perspective view of the prior art optical semiconductor device, a portion of which is sectioned. In the figure, reference numeral 2 designates an n-type InP substrate, numeral 3 designates a bottom surface electrode, numeral 4 designates a light absorption layer of the optical modulator, numeral 7 designates a top surface electrode, numeral 8 designates a semi-insulating Fe-doped InP layer, numeral 9 designates an n-type InP hole blocking layer. Reference numeral 11 designates an active layer of the DFB laser, numeral 12 designates a diffraction grating, numeral 14 designates a mesa-shaped waveguide, numeral 35 designates a p-type InP upper cladding layer, numeral 101 designates the DFB laser, and numeral 102 designates the optical modulator.

FIGS. 6(a) and 6(b) are diagrams illustrating the prior art optical semiconductor device. FIG. 6(a) is a schematic view of a cross-section when the optical semiconductor device is sectioned through a broken line 6b—6b in the figure and along a plane parallel to the mesashaped waveguide. In the figures, the same reference numerals as in FIG. 5 designate the same or corresponding parts. Reference numeral 36 designates a region between the optical modulator 102 and the DFB laser 101.

A description is given of the structure of the prior art semiconductor device. The DFB laser 101 with the diffraction grating 12 under the active layer enables a stable laser oscillation with a single wavelength. The active layer 11 of the DFB laser 101 and the light absorption layer 4 of the optical modulator 102 comprise a continuous InGaAs/InGaAsP multi quantum well layer (hereinafter referred to as MQW layer). The MQW layer is thicker in the DFB laser 101 than in the optical modulator 102. The width of each quantum well included in this layer is larger in the DFB laser 101 than in the optical modulator 102. Consequently, the difference in energy between ground levels of the conduction band and the valence band in the DFB laser 101 is smaller than that in the optical modulator 102. Therefore, when no bias voltage is applied to the optical modulator 102, light from the DFB laser 101 is not absorbed in the light absorption layer 4 of the optical modulator 102. However, when a reverse bias voltage is applied to the optical modulator 102, the light is absorbed due to the quantum-confinement Stark effort (QCSE). Therefore, light emitted from the DC-operating DFB laser 101 can be modulated by varying a bias voltage applied to the optical modulator 102.

Moreover, to bury the mesa-shaped waveguide, a semi-insulating Fe-doped InP layer 8 and an n-type InP hole blocking layer 9 are disposed at both sides of the waveguide which comprises a continuous MQW structure consisting of the light absorption layer 4 and the active layer 11, an upper cladding layer 35 disposed above the MQW structure, and a lower InP cladding layer beneath the MQW structure (not shown). The InP layer 8 and the hole blocking layer 9 serve as a current blocking structure, reducing the threshold current and improving the efficiency of the DFB laser. Since in the InP Fe is in a deep acceptor level, the semi-insulating Fe-doped InP cladding layer 8 can prevent electrons from diffusing from the n-type InP substrate 2, and the n-type InP hole blocking layer 9 can prevent holes from diffusing from the upper p-type InP cladding layer 35.

As shown in FIGS. 6(a) and 6(b), an interface between the n-type InP hole blocking layer 9 and the upper p-type InP cladding layer 35 defines a pn junction, and the junction capacitance $C_1$ is too large to be negligible for high speed operation of the optical modulator. The junction capacitance $C_3$ in the DFB laser 101 is also as large as $C_1$. On the other hand, the capacitances $C_2$ and $C_4$ between the n-type InP hole blocking layer 9 and the n-type InP substrate 2 are significantly smaller than $C_1$ or $C_3$ because, between these layers, there is interposed a thick semi-insulating Fe-doped InP layer 8. Since in the InP the mobility of electrons is considerably larger than that of holes, the electrical resistance of the n-type InP hole blocking layer 9 is low. Therefore, when the hole blocking layer is continuous through the optical modulator 102 and the DFB laser 101, there occurs a mutual interference between the modulator 101 and the DFB laser 102, the capacitance $C_3$ becomes associated with the capacitance $C_1$, and a parasitic capacitance of the optical modulator is increased, thereby impeding modulation at high frequencies. That is, the modulation bandwidth is narrow. In order to solve these problems, in the hole blocking layer 9 a portion 36 between the optical modulator 102 and the DFB laser 101 is removed by etching as shown in FIG. 6(b). In this etching, however, it is difficult to control etching depth, and the surface after the etching is rough.

FIGS. 7(a) and 7(b) illustrate another prior art optical semiconductor device in which the mutual interference is reduced between the modulator and the DFB laser without the etching-removal process. FIG. 7(a) is a cross-sectional view illustrating a whole structure of another prior art optical semiconductor device, and FIG. 7(b) is a partially cutaway view of the above device illustrating the inner structures of the modulator and the laser. This optical semiconductor device is disclosed in "Novel Current Blocking Structure for High Speed EA Modulator/DFB LD Integrated Light Source", I00C 95, Technical Digest, Vol.4, pp.60–61, 1995, by Y. Miyazaki et al.. The optical semiconductor device has a structure similar to that of the prior art device as described above, except that the n-type InP hole blocking layer 9 is interposed between two semi-insulating Fe-doped InP layers. In the figures, the same reference numerals as in FIG. 5 designate the same or corresponding parts, and reference numeral 1 designates an optical semiconductor device, numeral 5 designates a p-type InP second upper cladding layer, numeral 6 designates a p-type InGaAs contact layer, numeral 10 designates an upper semi-insulating Fe-doped InP layer, numeral 29 designates a protective film comprising an insulating film, and numeral 15 designates a mesa.

FIG. 8(a) is a cross-sectional view of the semiconductor device shown in FIGS. 7(a) and 7(b), and FIG. 8(b) is a schematic view of a cross section when the device is sectioned through a broken line 8b—8b and along a plane parallel to a mesa-shaped waveguide. In the figures, the same reference numerals as in FIGS. 7(a) and 7(b) designate the same or corresponding parts. Reference numeral 26 designates a p-type InP first upper cladding layer.

This semiconductor device has a structure similar to that of the conventional semiconductor device shown in FIG. 5, except that the upper semi-insulating Fe-doped InP layer 10 and the lower semi-insulating Fe-doped InP layer 8 are used in place of the conventional semi-insulating Fe-doped InP layer; the n-type InP hole blocking layer 9 is interposed between the layers 8 and 10, and a portion between the optical modulator 102 and the DFB laser 101 is not etched.

As shown in FIG. 8(b), the interface between the n-type InP hole blocking layer 9 and the upper semi-insulating Fe-doped InP layer 10 of the optical modulator 102 is not a pn junction. The junction capacitance $C_A$ between the p-type second cladding layer 5 and the hole blocking layer 9 is smaller than the capacitance $C_1$ of the optical modulator 102 in the above prior art optical semiconductor device shown in FIG. 5(b).

Moreover, the junction capacitance $C_C$ of the DFB laser 101 is as small as $C_A$. Thus, since the spacing of the pn junction, which is formed by the upper cladding layer 5 and the hole blocking layer 9, is wider than in the above prior art, the junction capacitance between these layers is reduced, so that the parasitic capacitances of the individual elements are reduced. This allows the device to operate at a frequency higher than in the first described prior art device. Even if the hole blocking layer 9 is continuous through the optical modulator 102 and the DFB laser 101 and the junction capacitance $C_A$ becomes associated with the capacitances $C_C$ and $C_D$ through the electrical resistance of the hole blocking layer 9, the capacitances $C_A$ and $C_C$ are considerably smaller than previously described, to reduce the mutual interference between the optical modulator 102 and the DFB laser 101. Therefore, no etching is required for a portion between the optical modulator 102 and the DFB laser 101.

Thus, in another prior art optical semiconductor device shown in FIGS. 7(a) and 7(b), it is possible to obtain superior element isolation characteristics without removing a portion between the laser 101 and the optical modulator 102 by etching, and to widen modulation bandwidth.

However, for an optical semiconductor device integrating two or more optical semiconductor elements that function differently, especially such as the prior art optical semiconductor device integrating an optical modulator and a DFB laser, it is necessary to design a structure that allows the elements of the device to operate with sufficient performances at the same time. In the case of the prior art device, it is required to have a structure in which parasitic capacitances between the optical modulator and the DFB laser is reduced, the mutual interference between the respective elements is reduced, and the basic light output-current characteristics (hereinafter referred to as P-I characteristics) is improved when the DFB laser oscillates. Especially, as shown in FIG. 7(a), in an optical semiconductor device integrating an optical modulator and a DFB laser which further includes, between two semi-insulting Fe-doped InP layers, a hole blocking layer that is continuous through the optical modulator and the DFB laser, the hole blocking layer and other layers of the optical modulator and the DFB laser are not separated by etching or the like and the hole blocking is conductive. Therefore, it is difficult to investigate exactly how the respective elements interfere each other, and to determine the design of the device by taking account of characteristics of the individual elements to realize the optimum optical semiconductor device. Thus, it is impossible to provide an optical semiconductor device in which its individual elements can operate with the utmost performances at the same time.

SUMMARY OF THE INVENTION

An object of the present invention is to provide an optical semiconductor device integrating two or more optical semiconductor elements, having superior element isolation characteristics and broad modulation bandwidth, and enabling the individual elements to operate with sufficient performances.

Another object of the present invention is to provide a method for fabricating the optical semiconductor device.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, an optical semiconductor device comprises an n-type InP substrate having top and bottom surfaces; a stripe-shaped mesa structure in which an n-type cladding layer, a MQW layer, and a p-type first upper cladding layer, all of which are alternatingly disposed on the top surface of the n-type InP substrate; a first layer comprised of a semi-insulating material, an n-type InP hole blocking layer having a carrier concentration equal to or less than $4\times10_{18}$ cm$^{-3}$ and more than $1\times10^{18}$ cm$^{-3}$, and a second layer comprised of the semi-insulating material, all of which are disposed on both sides of the mesa structure in this order to bury the mesa structure; a second p-type cladding layer and a p-type contact layer which are disposed on the mesa structure and the second layer comprised of the semi-insulating material; a plurality of p side electrodes disposed, separately from each other in the stripe direction of the mesa structure, on the p-type contact layer; and an n side electrode disposed on the bottom surface of the substrate. Therefore, it is possible to provide an optical semiconductor device integrating two or more optical semiconductor elements, having superior element isolation characteristics and broad modulation bandwidth, and enabling the respective elements to operate with sufficient performances.

According to a second aspect of the present invention, in the optical semiconductor device, a diffraction grating arranged in a stripe direction of the mesa structure is interposed between the n-type cladding layer and the first p-type cladding layer at a prescribed position near the MQW layer in a region opposite one of the p side electrodes.

Therefore, it is possible to provide an optical semiconductor device integrating two or more optical semiconductor elements, having superior element isolation characteristics and broad modulation bandwidth, and enabling the respective elements to operate with sufficient performances.

According to a third aspect of the present invention, in the optical semiconductor device, the p side electrodes are two in number; the n-type cladding layer and the p-type cladding layers made of InP; the diffraction grating is comprised of InGaAsP; and a part of the MQW layer opposite one of the p side electrodes and near the diffraction grating is thicker than the other part of the MQW layer. Therefore, it is possible to provide an optical semiconductor device integrating an optical modulator and a DFB laser, having superior element isolation characteristics and broad modulation bandwidth, and enabling the respective elements to operate with sufficient performances.

According to a fourth aspect of the present invention, a method of fabricating an optical semiconductor device comprises a process of preparing an n-type InP substrate having top and bottom surfaces; a process of growing an n-type cladding layer, a MQW layer, and a first p-type cladding layer on the n-type InP substrate; a process of selective etching the p-type first cladding layer and the n-type cladding layer, using a stripe-shaped selective mask to form a strip-shaped mesa structure; a process of successively growing a first layer comprised of a semi-insulating material, a n-type InP hole blocking layer having a carrier concentration equal to or less than $4 \times 10^{18}$ cm$^{-3}$ and more than $1 \times 10^{18}$ cm$^{-3}$, and a second layer comprised of the semi-insulating material, using the selective mask, to bury the mesa structure; a process of forming a second p-type cladding layer and a p-type contact layer on the mesa structure and the second layer comprised of the semi-insulating material after removal of the selective mask; a process of forming on the p-type contact layer a plurality of p side electrodes separately from each other in a stripe direction of the mesa structure; and a process of forming an n-type electrode on the bottom surface of the substrate. Therefore, it is possible to provide an optical semiconductor device integrating two or more optical semiconductor elements, having superior element isolation characteristics and broad modulation bandwidth, and enabling the respective elements to operate with sufficient performances.

DETAILED DESCRIPTION OF THE PREFERRED EMBODIMENT

An optical semiconductor device in accordance with an embodiment of the present invention comprises a stripe-shaped mesa structure which comprises an n-type cladding layer, a MQW layer, and a p-type first upper cladding layer on an n-type InP substrate; a first layer comprising a semi-insulating material, an n-type InP hole blocking layer having a carrier concentration equal to or less than $4 \times 10^{18}$ cm$^{-3}$ and more than $1 \times 10^{18}$ cm$^{-3}$, and a second layer comprising the semi-insulating material, all of which are disposed in this order to bury the mesa structure; a p-type second cladding layer and a p-type contact layer which are disposed on the second layer comprising the semi-insulating material and the mesa structure; a plurality of p side electrodes spaced from each other in a stripe direction of the mesa structure, on the p-type contact layer; and an n side electrode disposed on a bottom surface of the substrate. Therefore, it is possible to considerably reduce capacitance between the hole blocking layer and the second upper cladding layer to reduce capacitances between the individual elements, resulting in a decrease in mutual interference between the individual elements. In addition, the leakage of radio-frequency (RF) signals from the modulator to the laser can be held to −30 dB or less, and the generation of kinks in the laser can be prevented. These characteristics lead to obtaining an optical semiconductor device integrating two or more optical semiconductor elements, which has superior element isolation characteristics and broad modulation bandwidth, and enables the respective elements to operate with sufficient performances.

Figure 1:
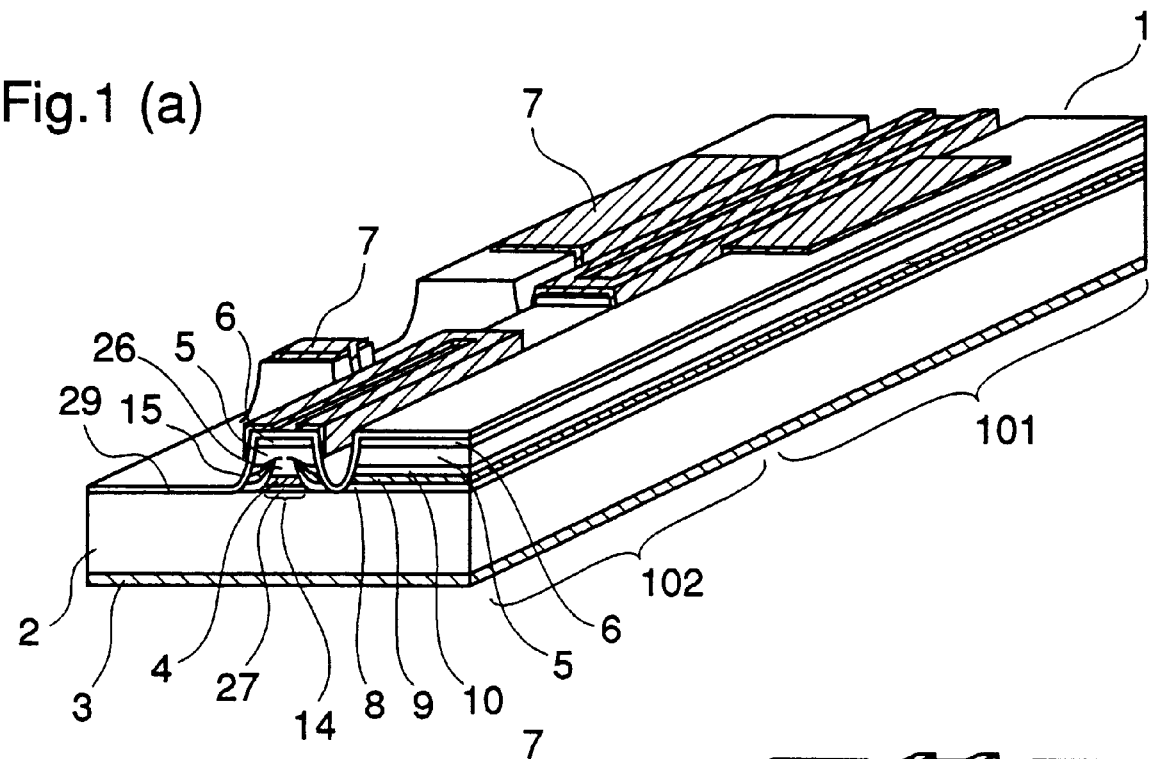
FIGS. 1(a) and 1(b) are diagrams illustrating a structure of an optical semiconductor device according to an embodiment of the present invention.
Figure 1:
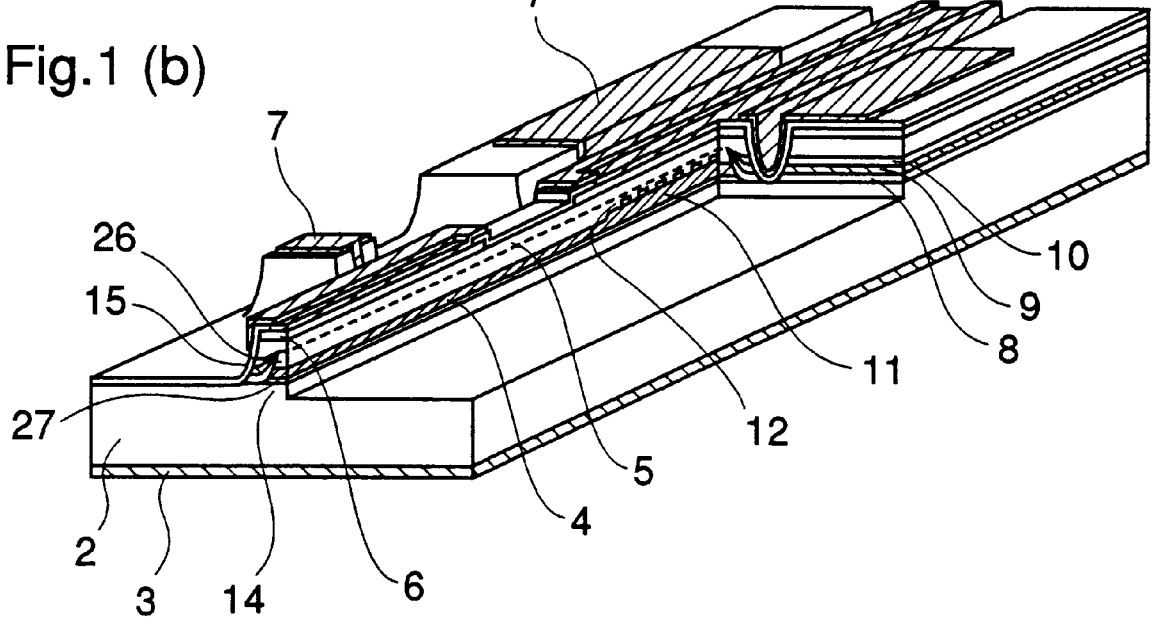

A detailed description is given of the embodiment of the present invention. FIG. 1(a) is a perspective view illustrating the structure of an optical semiconductor device according to the embodiment of the present invention, and FIG. 1(b) is a partially cutaway view of the device of FIG. 1(a). In the figures, reference numeral 1 designates the optical semiconductor device integrating the optical modulator and the DFB semiconductor laser on a single substrate. Reference numeral 2 designates the n-type InP substrate, numeral 27 designates a lower n-type InP cladding layer preferably about 0.1 μm in thickness, numerals 4 and 11 designate a light absorption layer of the optical modulator and a MQW active layer of the DFB laser, respectively. Preferably, the MQW active layer of the DFB laser comprises a MQW layer in which InGaAs well layers about 4.5 nm thick and InGaAs barrier layers about 5 nm thick are alternatingly laminated so that the total number of the well layers amounts to eight. The resulting layers are sandwiched by InGaAsP guide layers about 1.18 μm thick. Reference numeral 12 designates an embedded InGaAsP diffraction grating. In place of the InGaAsP diffraction grating, any diffraction gratings of any structure can be used. The diffraction grating 12 may be disposed in the lower cladding layer. Reference numeral 26 designates a p-type InP first upper cladding layer having 0.2 μm thick, numeral 14 designates the mesa structure, numerals 8 and 10 designate lower and upper semi-insulating Fe-doped InP layers, respectively. In place of semi-insulating Fe-doped InP, a semi-insulating InP doped with Ti or the like, which serves as a deep acceptor in the InP, may be used. There can also be used other semi-insulating materials such as a semi-insulating non-doped AlInAs layer which has a band gap energy larger than InP and can prevent carriers from diffusing from the InP cladding layers. Reference numeral 9 designates an n-type InP hole blocking layer whose carrier concentration is equal to or less than $4\times10^{18}$ cm$^{-3}$ and more than $1\times10^{18}$ cm$^{-3}$. Numeral 5 designates a p-type InP second upper cladding layer about 1.5 μm in thickness, numeral 6 designates a contact layer of p-type InGaAs or the like and having a thickness of about 0.2 μm, numeral 29 designates a protective film comprising an insulating film comprising SiO$_2$ or the like, numeral 3 designates a bottom surface electrode comprised of Ti/Au/Pt or the like, numeral 7 designates a top surface electrode made of Cr/Au or the like, numeral 15 designates a mesa, numeral 101 designates a DFB laser, and numeral 102 designates an optical modulator. Doping densities of the lower n-type cladding layer 27, the p-type first upper cladding layer 26, the p-type second upper cladding layer 5 and the contact layer 6 are about $1\times10^{18}$ cm$^{-3}$ whether the layers are p-type or n-type.

FIGS. 2(a) to 2(k) are the diagrams illustrating the processes in a method of fabricating the optical semiconductor device in accordance with the embodiment of the present invention. In the figures, the same reference numerals as in FIGS. 1(a) and 1(b) designate the same or corresponding parts. Reference numeral 21 designates a selective growth mask of SiO$_2$, numeral 13 designates a p-type InP barrier layer, numeral 22 designates an InGaAs/InGaAsP MQW layer, numeral 23 designates an InGaAsP guide layer, numeral 24 designates a p-type InP cap layer, numeral 31 designates an etching mask made of SiO$_2$, numeral 28 designates an isolation groove, and numeral 26a designates a p-type InP layer.

Figure 2:
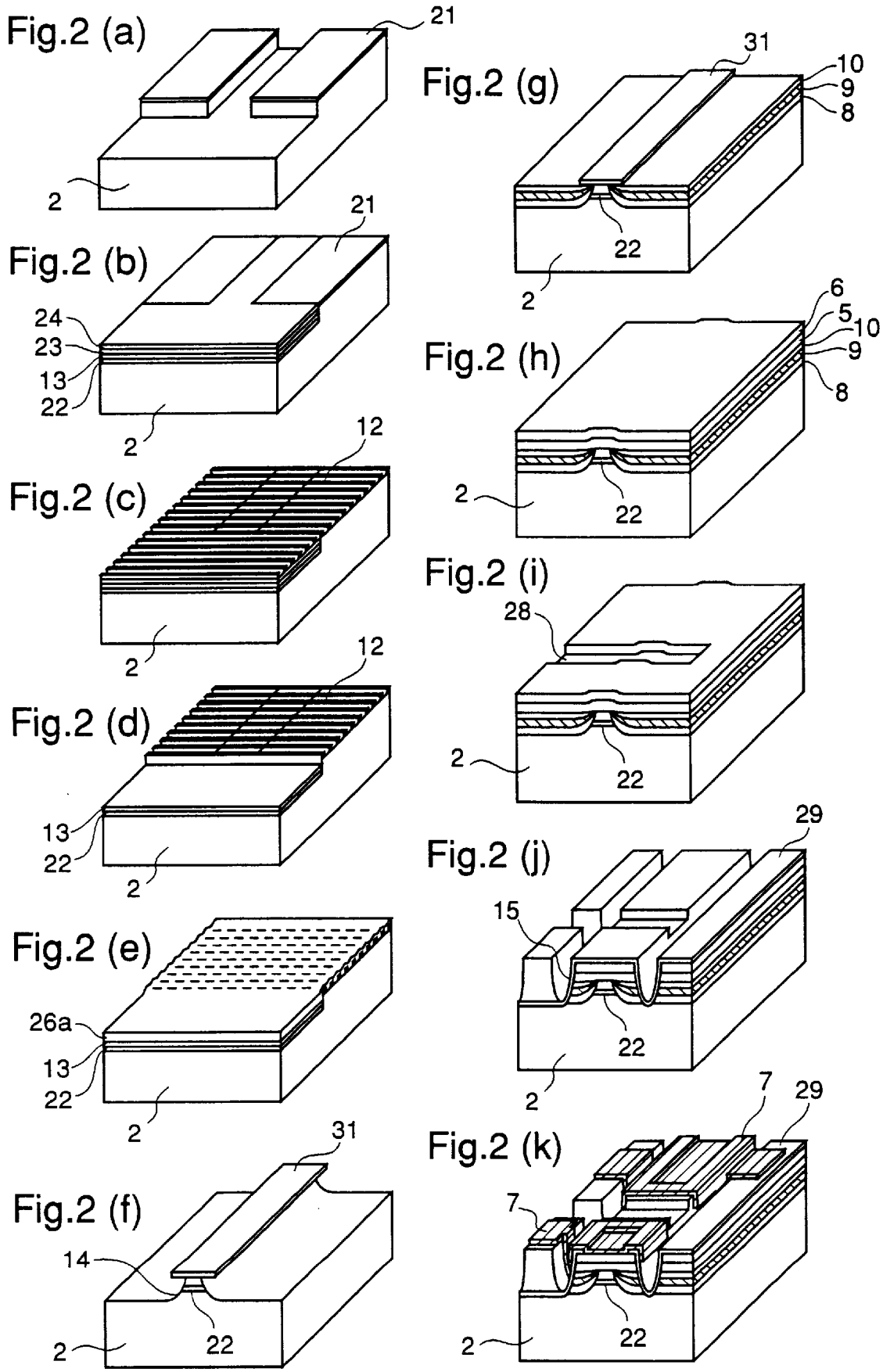
FIGS. 2(a) to 2(k) are diagrams illustrating processes in a method of fabricating an optical semiconductor device according to the embodiment of the present invention.

Next, a description is given of a method of fabricating the device. As shown in FIG. 2(a), a pair of stripe-shaped selective growth masks 21 is formed on a surface of the n-type InP substrate 2 so that a region where a mesa-shaped waveguide of the DFB laser is later formed is present between the masks, and the substrate, other than these masked regions, is etched to a prescribed depth. Then, as shown in FIG. 2(b), on the substrate other than the regions masked by the SiO$_2$, the lower n-type InP cladding layer 27, the InGaAs/InGaAsP MQW layer 22, the p-type InP barrier layer 13, the InGaAsP guide layer 23, the p-type InP cap layer 24 are successively grown using MOCVD (metal-organic chemical vapor depositions). The layers grown on the region between the SiO$_2$ masks 21 are thicker than the layers grown on the other region. Therefore, the thickness of the MQW layer 22 in the region between these masks 21 is thicker than that of the other region. Afterward, the masks 21 are removed.

After applying a photoresist (not shown) on the entire surface of the wafer, a periodic resist pattern is formed using the interference exposure technique and, using the resist as a mask, the p-type InP cap layer 24 and the InGaAsP guide layer 23 are etched to form the diffraction grating 12 having a periodic pattern and comprising the InGaAsP guide layer 23 and the p-type InP cap layer 24 disposed on the top surface of the guide layer 23, as shown in FIG. 2(c).

As shown in FIG. 2(d), the p-type InP cap layer 24 and the InGaAsP guide layer 23 in a region where an optical modulator is later formed (hereinafter referred to as optical modulator section) are removed by etching to leave the diffraction grating 12 in a region where the DFB laser is later formed (hereinafter referred to as DFB laser section). Thereafter, a p-type InP layer 26a is grown on the entire surface using MOCVD, as shown in FIG. 2(e). The p-type InP layer 26a, the p-type InP barrier layer 13 and the p-type InP cap layer 24 are made of the same material, and they all function as a part of the upper cladding layer in the optical semiconductor device. Therefore, they are collectively called the p-type InP first upper cladding layer 26 in FIG. 1.

As shown in FIG. 2(f), the SiO$_2$ etching mask 31 is formed on a region where a mesa structure is later formed and, using the etching mask as a mask, wet etching is performed to form the mesa structure 14. Moreover, as shown in FIG. 2(g), using the etching mask 31 as a selective growth mask, the lower semi-insulating Fe-doped InP layer 8, the n-type InP hole blocking layer 9 and the upper semi-insulting Fe-doped InP layer 10 are successively and selectively grown at both sides of the mesa structure 14 to bury the mesa structure. As shown in FIG. 2(h), after removal of the etching mask 31, a p-type InP second upper cladding layer 5 and a p-type InGaAs contact layer 6 are successively grown using MOCVD, on the entire surface.

Thereafter, a portion of the p-type InGaAs contact layer 6 between the DFB laser and the optical modulator is removed by etching to form the isolation groove 28. As shown in FIG. 2(j), the mesa 15 is formed by etching the regions on both sides of the DFB laser section and the optical modulator section, and the SiO$_2$ protective film 29 is diposited on the entire surface by sputtering. Then, portions of the SiO$_2$ protective film 29, located directly above the active layer of the DFB layer and the light absorption layer of the optical modulator, are removed, and the Cr/Au film is deposited on the entire surface. Then, as shown in FIG. 2(k), a region where top surface electrodes are later formed is plated with Au, and the Cr/Au film is etched using this Au plated layer as a mask to form Cr/Au top surface electrodes 7. After grinding the bottom surface of the n-type InP substrate 2, the Ti/Pt/Au bottom surface electrode 3 is formed, thereby producing the optical semiconductor device integrating the DFB laser and the optical modulator shown in FIGS. 1(a) and 1(b).

Next, a description is given of the operation. The embedded InGaAsP diffraction grating 12 of the DFB laser 101 oscillates to produce a stable light of a single wavelength. The thickness of the light absorption layer 4 comprising the MQW layer in the optical modulator 102 is smaller than that of the active layer 11 in the DFB laser 101, and the width of the quantum well of the light absorption layer is smaller than that of the quantum well of the active layer. The difference in energy between ground levels of the conduction band and the valence band inside the quantum well in the DFB laser is smaller than that in the optical modulator. When no bias voltage is applied to the optical modulator, no light from the DFB laser 101 is absorbed by the light absorption layer 4. When a reverse bias voltage is applied to the optical modulator, light is absorbed due to the quantum confinement Stark effect (QCSE). Therefore, if light from the direct-current operating DFB laser 101 is modulated by varying the bias voltage applied to the optical modulator 102, the intensity of the light emitted from a facet of the optical modulator 102 is changed in accordance with the applied bias voltage.

On both sides of the mesa structure 14, the lower semi-insulating Fe-doped InP layer 8, the n-type InP hole blocking layer 9, and upper semi-insulating Fe-doped InP layer 10 are laminated. Since Fe is a deep acceptor in the InP, the lower semi-insulating Fe-doped InP layer 8 can prevent electrons from diffusing from the n-type InP substrate 2, and the n-type InP hole blocking layer 9 can prevent holes from diffusing from the p-type InP upper cladding layer 5.

Since the upper semi-insulating Fe-doped InP layer 10 is present between the n-type InP hole blocking layer 9 and the p-type InP second upper cladding layer 5, the capacitance between the hole blocking layer 9 and the second upper cladding layer 5 is small, and the capacitance between the hole blocking layer 9 and the n-type InP substrate 2 is also small. Therefore, the hole blocking layer 9 is continuous through the DFB laser 101 and the optical modulator 102. In a path through the electrical resistance of the hole blocking layer, the mutual interference between the DFB laser 101 and the optical modulator 102 is lowered so that individual elements are isolated. This allows the optical modulator 102 to operate at a higher frequency and widen its modulation bandwidth.

Figure 7:
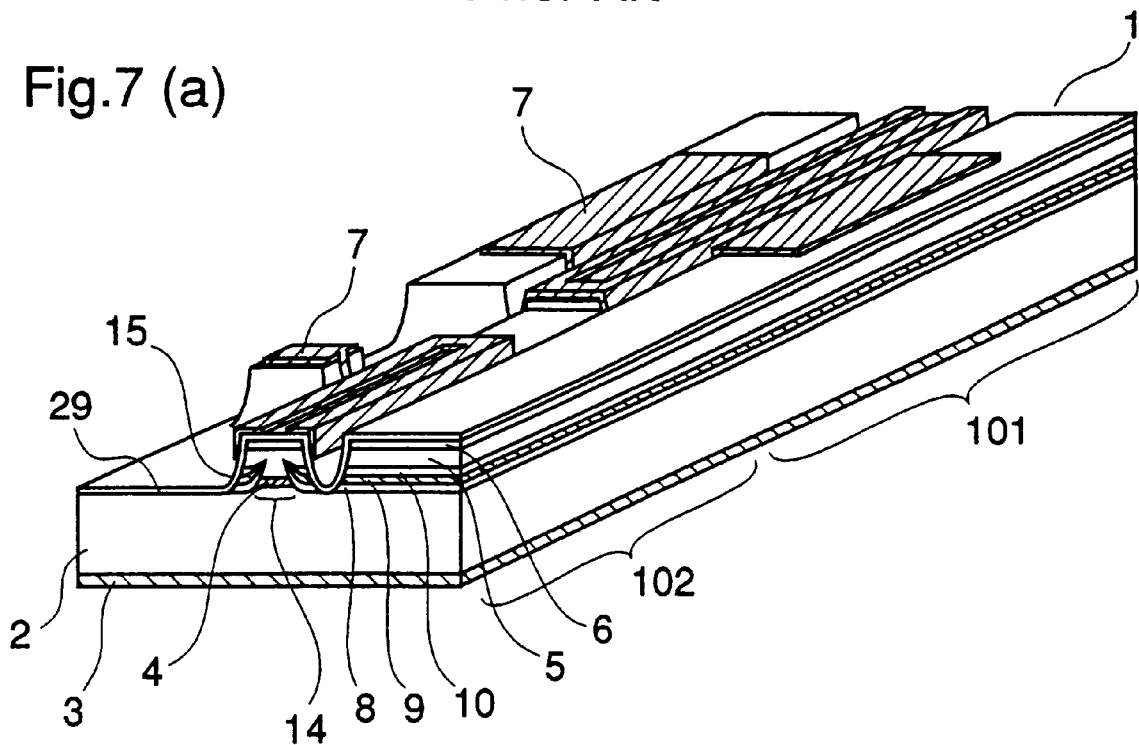
FIGS. 7(a) and 7(b) are diagrams illustrating a structure of another conventional optical semiconductor device.
Figure 7:
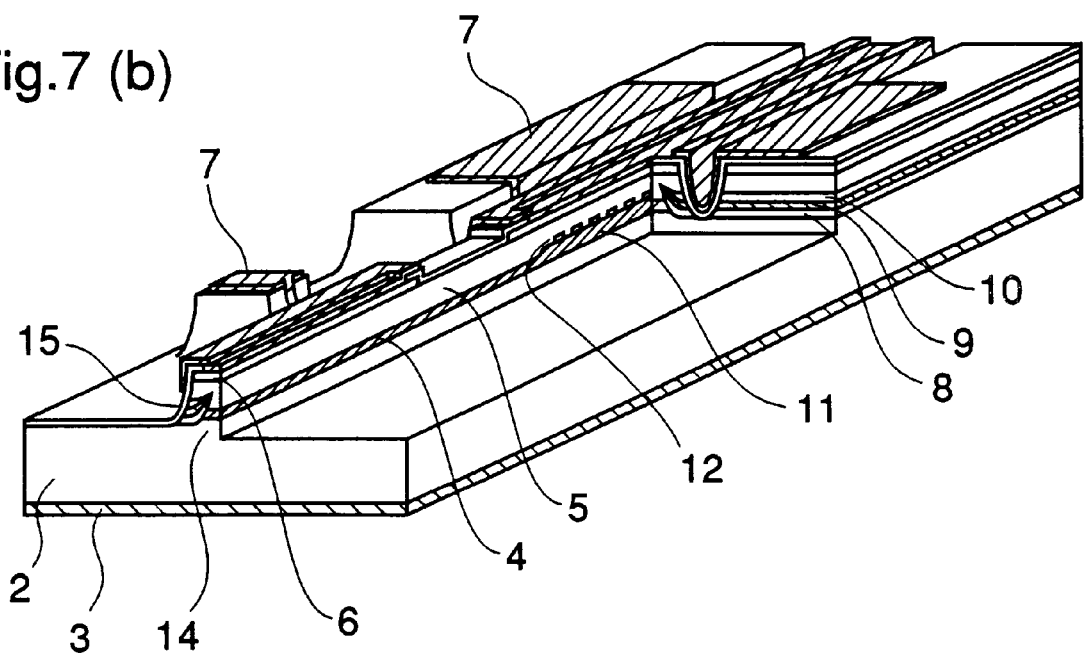
Figure 8:
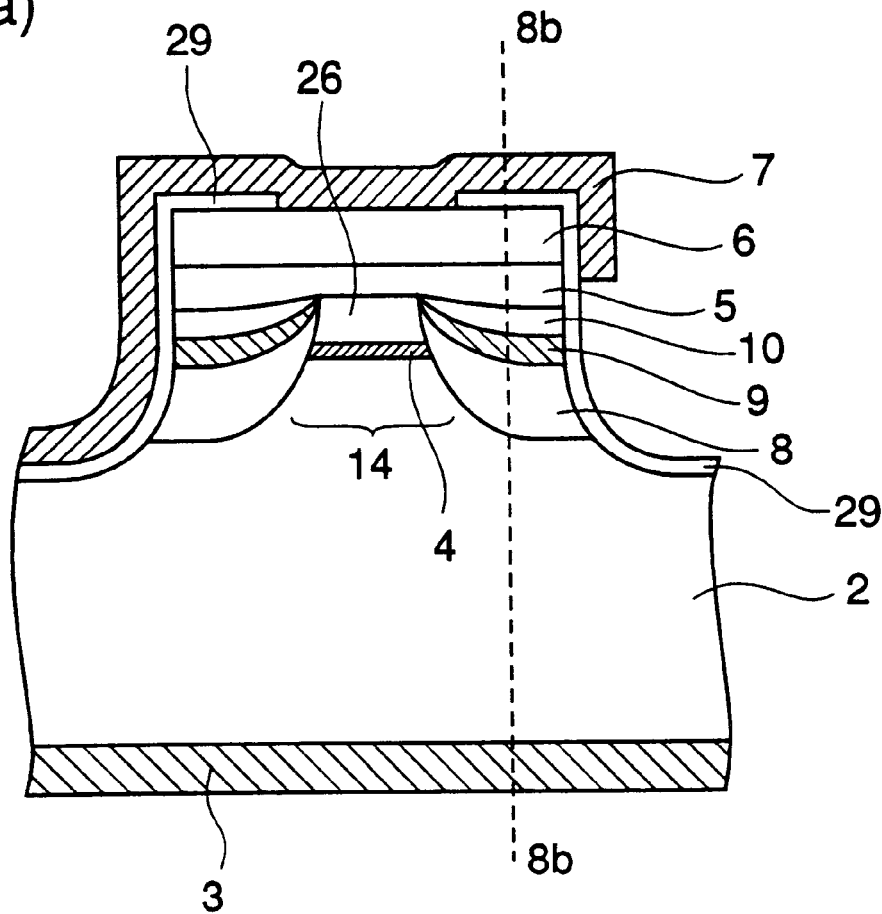
FIG. 8(a) is a cross-sectional view illustrating a structure of another conventional optical semiconductor device.
FIG. 8(b) is a schematic cross section when the device of FIG. 8(a) is sectioned through a broken line 8b—8b of FIG. 8(a) and along a plane parallel to a mesa-shaped waveguide.
Figure 8:
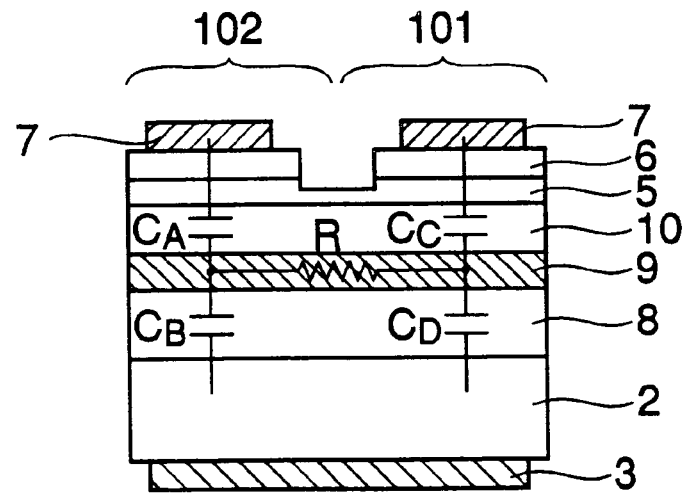

As mentioned in the description of the prior art, for the optical semiconductor device, integrating the optical modulator and the DFB laser and having the continuous hole blocking layer which is disposed between the semi-insulating Fe-doped InP layers and extends through the optical modulator and the DFB laser shown in FIGS. 7(*a*) and 7(*b*), decreases the mutual interference between the elements, improves the P-I characteristics, and decreases parasitic capacitance between the DFB laser and the optical modulator, in order that the individual elements satisfactorily perform their own functions at the same time.

After the intensive researches of the present inventors, they have discovered that adequate carrier concentration is present in the n-type InP hole blocking layer of the optical semiconductor device integrating the optical modulator and the DFB laser and comprising a current blocking structure in which the continuous n-type InP hole blocking layer between the semi-insulating Fe-doped InP layers is interposed.

Figure 3:
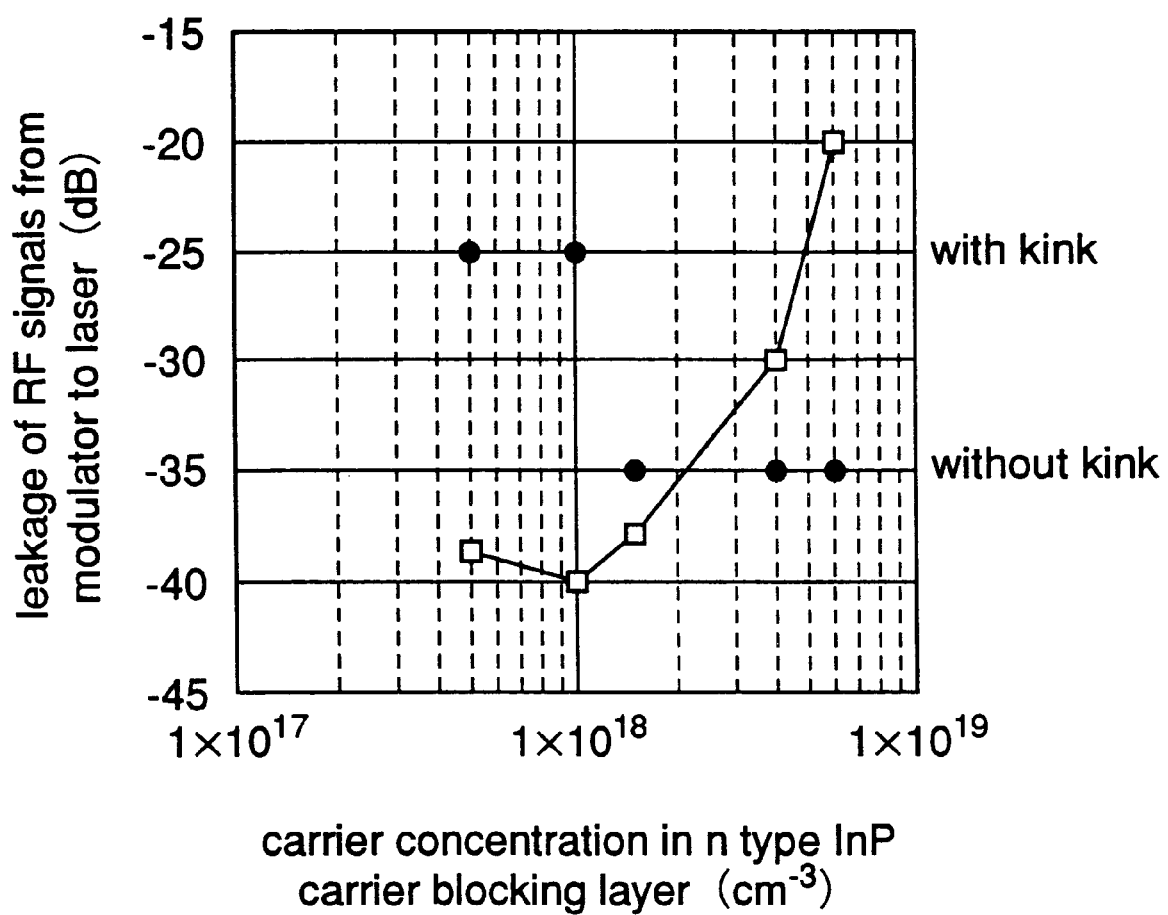
FIG. 3 is a diagram illustrating the structure of an optical semiconductor device according to an embodiment of the present invention.

FIG. 3 is a diagram illustrating a relationship between the leakage of the RF modulating signals between the optical modulator and the DFB laser, and the carrier concentration in the n-type InP hole blocking layer 9, and a relationship between a current large enough to generate kinks in the P-I characteristics and the carrier concentration in an optical semiconductor device having the same structure as that of the first embodiment. The abscissa of the graph designates the carrier concentration ($cm^{-3}$) of the n-type InP hole blocking layer 9, and the left ordinate designates the leakage (dB) of the RF signals from the modulator 102 to the laser 101. As for the relation between the generation of kinks and the carrier concentration, the right ordinate designates the presence or absence of kinks in the laser light. In the figure, dots (●) indicate the relationship between the carrier concentration of the hole blocking layer 9 and the generation of kinks, and squares (□) indicate the relationship between the carrier concentration of the hole blocking layer 9 and the leakage of the RF signals. The thicknesses of the Fe-doped InP layer 8, the n-type InP hole blocking layer 9, and the Fe-doped InP layer 10 are 2 μm, 0.5 μm, and 1 μm, respectively.

Referring to FIG. 3, a description is given of the leakage of the RF modulation signals between the elements with respect to the aforesaid carrier concentrations shown in FIG. 3. When the DFB laser 101 is in operation, i.e., in a laser oscillation state by injecting currents, and the RF driving signals are input into the optical modulator 102, the RF signals leaking from the optical modulator 102 to the DFB laser 101 modulates the oscillation of the DFB laser 101, thus making it unstable. Therefore, the leakage of the signals should be held to about −30 dB or less. However, the leakage of the RF signals exceeds −30 dB in a region where the n-type carrier concentration of the hole blocking layer is more than $4 \times 10^{18}$ $cm^{-3}$. This phenomenon is attributed to the fact that when the n-type carrier concentration in the n-type hole blocking layer exceeds −30 dB, the leakage of the RF signals to the laser 101 through the n-type hole blocking layer 9 is increased.

A description is given of the operation of the DFB laser 101 when injecting current, that is, laser oscillation with respect to the carrier concentration of the n-type InP hole blocking layer 9. Basically, the DFB laser 101 is required to be linear in regard to the relationship between the laser beam output P and the injected current I. Especially, when the laser is in a state of high power output with increased injected current, linearity and stability are indispensable. In that case, however, kinks are generated when the carrier concentration of the n-type InP hole blocking layer is less than $1 \times 10^{18}$ $cm^{-3}$.

Figure 4:
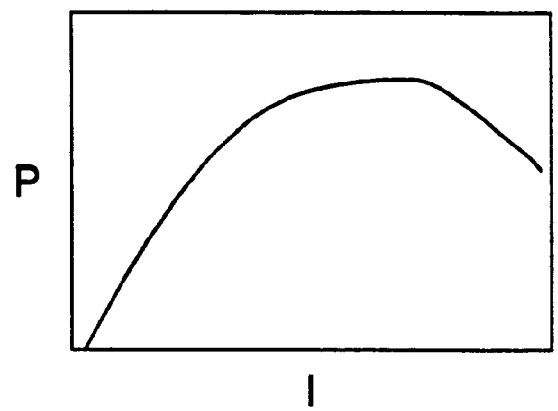
FIGS. 4(a) to 4(c) are diagrams illustrating the structure of the optical semiconductor device according to an embodiment of the present invention.
Figure 4:
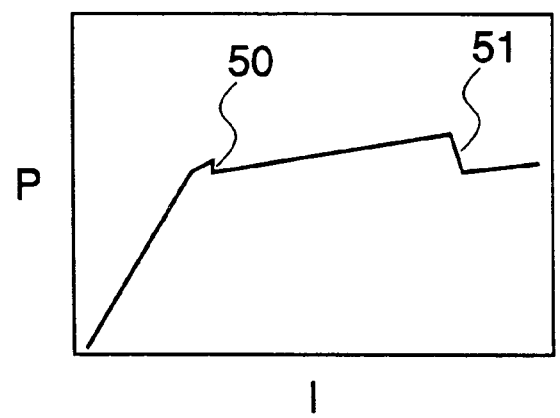
Figure 4:
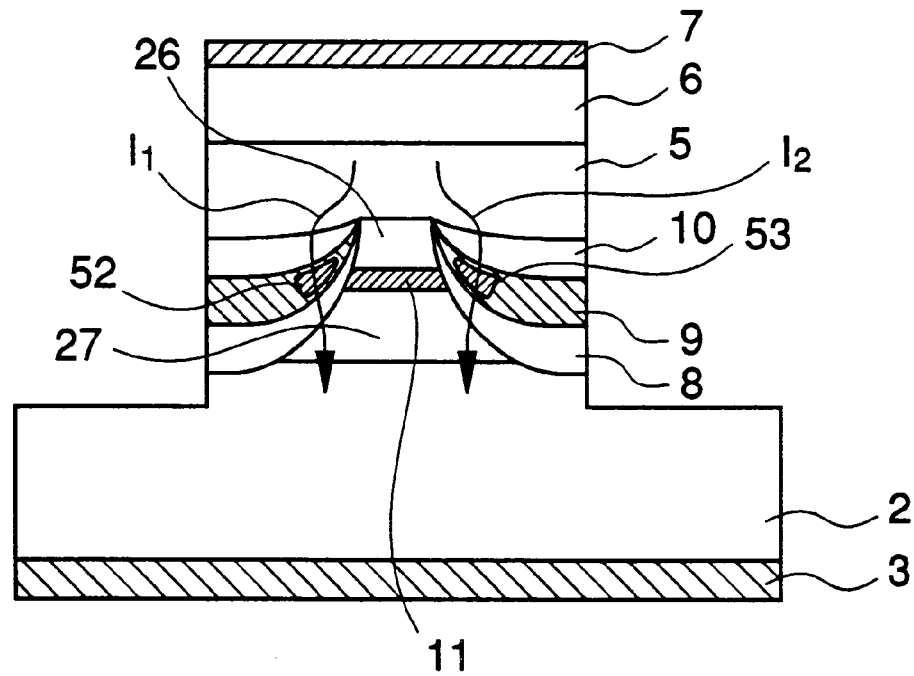
Figure 5:
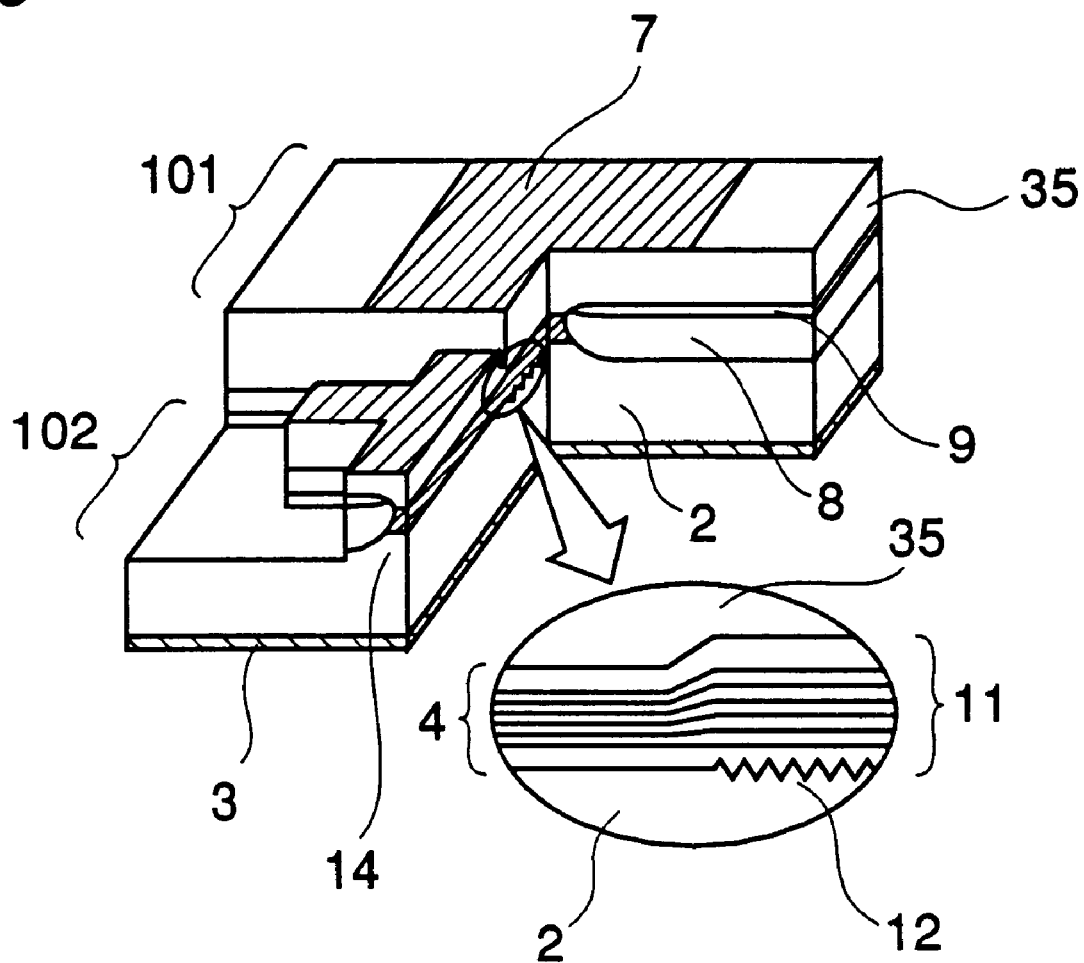
FIG. 5 is a perspective view illustrating a structure of a conventional optical semiconductor device.
Figure 6:
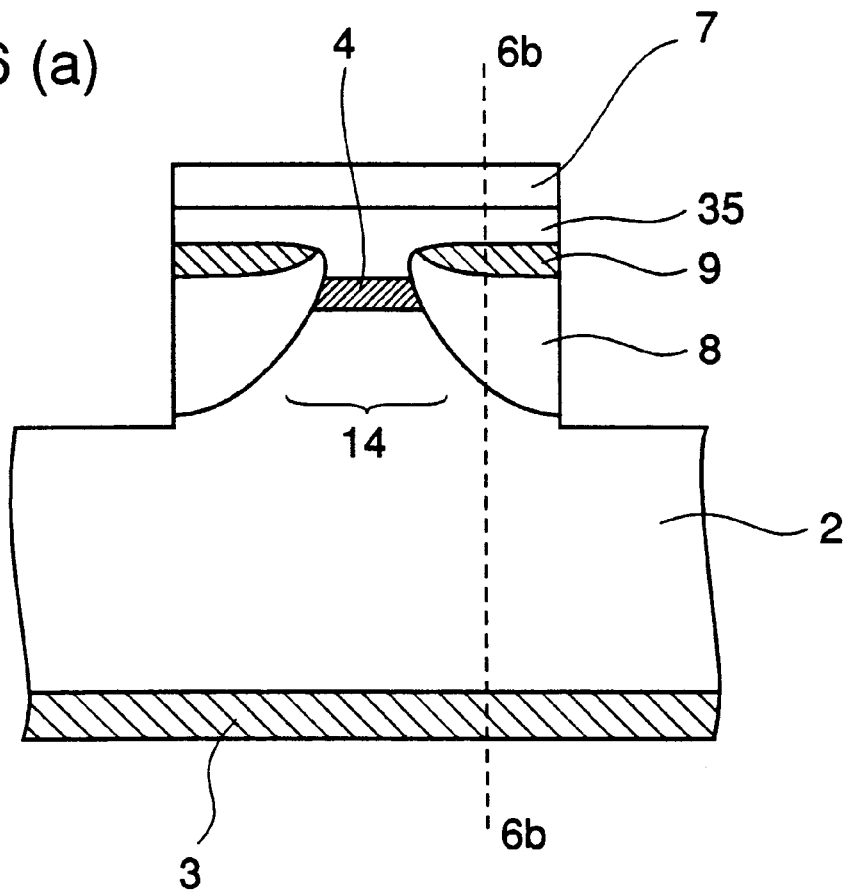
FIG. 6(a) is a cross-sectional view illustrating the structure of a conventional optical semiconductor device.
FIG. 6(b) is a schematic cross section when the device of FIG. 6(a) is sectioned through a broken line 6b—6b of FIG. 6(a) and along a plane parallel to a mesa-shaped waveguide.
Figure 6:
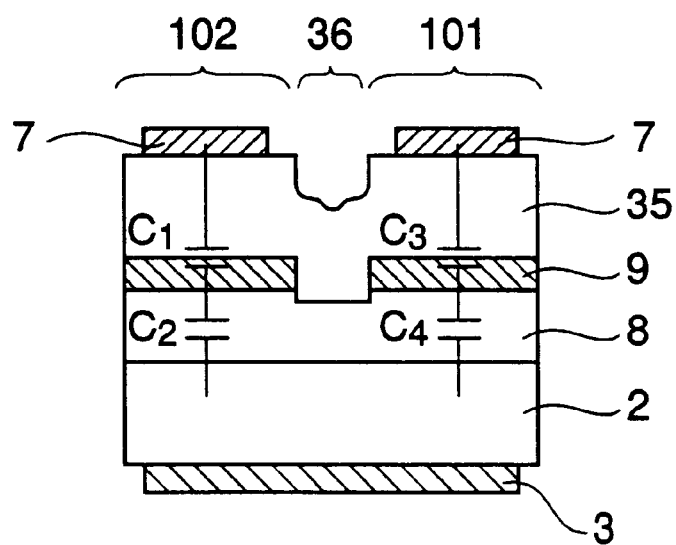

FIG. 4(*a*) shows the typical P-I characteristics of a general semiconductor laser, and FIG. 4(*b*) shows a typical P-I characteristic of a general semiconductor laser when kinks are generated. In FIG. 4(*b*), reference numerals 50 and 51 designate kinks. The reason why such kinks are generated is that when the carrier concentration of the hole blocking layer 9 is less than $1 \times 10^{18}$ $cm^{-3}$, holes from the upper cladding layer 5 and the p-type InP layer 26, and electrons from the lower n-type InP cladding layer 27 and the n-type InP substrate 2, flow into the n-type hole blocking layer 9; the holes and the electrons recombine in the hole blocking layer 9, increasing current flow; the recombination current that does not contribute to laser oscillation is increased; and the current blocking function of the lower semi-insulating Fe-doped InP layer 8, the upper semi-insulating Fe-doped InP layer 10 and the hole blocking layer 9 is impaired, resulting in loss of efficiency in the laser oscillation of the laser 101.

FIG. 4(*c*) is a cross-sectional view of the DFB laser 101 for illustrating a state in which kinks are generated. In the figure, the same reference numerals as in FIGS. 1(*a*) and 1(*b*) designate the same or corresponding parts. Reference numerals $I_1$ and $I_2$ designate the recombination currents flowing through the hole blocking layer 9, and numerals 52 and 53 designate the locations at which recombination and light emission occur.

Based on the research of the inventors, a current blocking structure has the n-type InP hole blocking layer 9 is interposed between the semi-insulating Fe-doped InP layers 8 and 10. The current blocking structure is disposed on both sides of the mesa structure, burying the mesa structure in which the MQW layer, consisting of the layers 4 and 11, is sandwiched between the InP cladding layers 26 and 27. When the carrier concentration of the n-type InP hole blocking layer 9 is equal to or less than $4 \times 10^{18}$ $cm^{-3}$ and more than $1 \times 10^{18} cm^{-3}$, the leakage of the RF signals from the modulator 102 to the laser 101 can be held to −30 dB or less, and the generation of kinks in the laser 101 can be prevented. This shows that the carrier concentration of the aforesaid range is an optimum value for the hole blocking layer. Therefore, in an optical semiconductor device in accordance with this embodiment, by setting the carrier concentration of the hole blocking layer 9 within the aforesaid range, the leakage of the RF signals from the modulator 102 to the laser 101 can be held to −30 dB or less, and the generation of kinks can be prevented, whereby the individual elements can operate satisfactorily at the same time.

As described above, according to the embodiment, the optical modulator 102 and the DFB laser 101 are integrated and the n-type InP hole blocking layer 9 is continuous through the semi-insulating Fe-doped InP layers 8 and 10 and has a carrier concentration equal to or less than $4 \times 10^{18}$ $cm^{-3}$ and more than $1\times10^{18}$ $cm^{-3}$. Therefore, in the optical semiconductor device in which the mutual interference between the DFB laser 101 and the optical modulator 102 is reduced and the modulator 102 can operate at a higher frequency, there are advantages that the leakage of RF signals from the modulator 102 to the laser 101 can be held to −30 dB or less and the generation of kinks in the laser 101 can be prevented. It is therefore possible to provide an optical semiconductor device integrating the DFB laser and the optical modulator which has superior electrical isolation characteristics and broad modulation bandwidth, and enables the individual elements to operate with adequate performances.

In the embodiment, there is described the case where the optical modulator and the DFB laser each have a mesa structure and are integrated, and an n-type InP hole blocking layer having a carrier concentration equal to or less than $4\times10^{18}$ $cm^{-3}$ and more than $1\times10^{18}$ $cm^{-3}$ is provided, and is continuous through the optical modulator and the DFB laser, and is sandwiched between the semi-insulating Fe-doped InP layers 8 and 10 burying the mesa structure. The present invention, however, can be applied to a case where a plurality of optical semiconductor elements each having the mesa structure are integrated, in which case the same effects as in the above embodiment are available.

For example, in a case where an element having the same structure as the device shown in FIGS. 1(a) and 1(b) is provided, when a current level less than that at which laser oscillations occur is applied to the element, and the on-off switching of the current is controlled by an external source, the element can serve as a wave length selective filter which selects a specific wavelength. Therefore, by integrating this element with the optical semiconductor according to the embodiment, it is possible to obtain an optical semiconductor device integrating the optical modulator the DFB laser, and the wavelength selective filter, thereby allowing the respective elements to operate with sufficient performances.

In an element having the structure as in the optical modulator of the optical semiconductor device shown in FIGS. 1(a) and 1(b), when a MQW layer is grown to have a thickness of at least 50 µm, preferably about 100 µm, so that its band gap energy is greater than that of the MQW layer of the optical modulator, the obtained element can be used as a waveguide. Therefore, by integrating the element into an optical semiconductor device in accordance with the embodiment, an optical semiconductor device integrating the waveguide, the optical modulator, and the DFB laser is available.

What is claimed is:

1. An optical semiconductor device comprising:
    an n-type InP substrate having top and bottom surfaces;
    a stripe-shaped mesa structure comprising an n-type cladding layer, a multi quantum well layer, and a first p-type upper cladding layer, successively disposed on the top surface of the n-type InP structure;
    a first semi-insulating layer and an n-type InP hole blocking layer having a carrier concentration not exceeding $4\times10^{18}$ $cm^{-3}$ and more than $1\times10^{18}$ $cm^{-3}$, and a second semi-insulating layer, successively disposed and burying side surfaces of the mesa structure;
    a second p-type cladding layer and a p-type contact layer disposed on the mesa structure and on the second semi-insulating layer;
    a plurality of p side electrodes spaced from each other in a stripe direction of the mesa structure and disposed on the p-type contact layer; and
    an n side electrode disposed on the bottom surface of the substrate.

2. The optical semiconductor device of claim 1 including a diffraction grating arranged in the stripe direction of the mesa structure disposed near the multi quantum well layer, opposite one of the p side electrodes.

3. The optical semiconductor device of claim 2 including two p side electrodes and wherein the n-type cladding layer and the p-type cladding layer are InP, the diffraction grating is InGaAsP, and the multi quantum well layer is thicker opposite the p side electrode that is opposite the diffraction grating than elsewhere.

* * * * *